United States Patent
Nabatame et al.

(10) Patent No.: US 10,290,802 B2
(45) Date of Patent: May 14, 2019

(54) VARIABLE RESISTANCE DEVICE AND METHOD FOR MANUFACTURING SAME

(71) Applicant: National Institute for Materials Science, Ibaraki (JP)

(72) Inventors: Toshihide Nabatame, Tsukuba (JP); Tadaaki Nagao, Tsukuba (JP)

(73) Assignee: National Insitute for Materials Science, Ibaraki (JP)

( * ) Notice: Subject to any disclaimer, the term of this patent is extended or adjusted under 35 U.S.C. 154(b) by 0 days.

(21) Appl. No.: 15/536,150

(22) PCT Filed: Jan. 13, 2016

(86) PCT No.: PCT/JP2016/050853
§ 371 (c)(1),
(2) Date: Jun. 15, 2017

(87) PCT Pub. No.: WO2016/114311
PCT Pub. Date: Jul. 21, 2016

(65) Prior Publication Data
US 2017/0346006 A1    Nov. 30, 2017

(30) Foreign Application Priority Data
Jan. 15, 2015  (JP) .................................. 2015-005464

(51) Int. Cl.
*H01L 45/00*  (2006.01)
*H01L 27/24*  (2006.01)
(Continued)

(52) U.S. Cl.
CPC ............ *H01L 45/146* (2013.01); *C23C 16/40* (2013.01); *H01L 27/105* (2013.01);
(Continued)

(58) Field of Classification Search
CPC . H01L 45/146; H01L 45/1233; H01L 45/166; H01L 27/2481
See application file for complete search history.

(56) References Cited

U.S. PATENT DOCUMENTS

| 9,391,274 B2 | 7/2016 | Kim et al. |
| 2007/0210354 A1 | 9/2007 | Nabatame et al. |

(Continued)

FOREIGN PATENT DOCUMENTS

| JP | 2007-243009 A | 9/2007 |
| JP | 2009-021560 A | 1/2009 |

(Continued)

OTHER PUBLICATIONS

B. J. Choi et al., "Resistive switching mechanism of TiO2 thin films grown by atomic-layer deposition", Journal of Applied Physics, vol. 98, 033715 (2005).

(Continued)

*Primary Examiner* — Christine A Enad
(74) *Attorney, Agent, or Firm* — Morgan, Lewis & Bockius LLP

(57) ABSTRACT

The forming voltage of a variable resistance device used in a non-volatile memory and the like is decreased, and repetition characteristics are improved. In an element structure in which a metal oxide film is sandwiched between a lower electrode and an upper electrode, an island-shaped/particulate region of amorphous aluminum oxide or aluminum oxycarbide is formed on the metal oxide film. Because an oxide deficiency, serving as the nucleus of a filament for implementing an on/off operation of the variable resistance device, is formed from the beginning under the island-shaped or particulate aluminum oxide or the like, the conventional creation of an oxide deficiency by high-voltage application in the initial period of forming can be eliminated.

(Continued)

A WITH AMORPHOUS ALUMINUM OXIDE

B WITHOUT AMORPHOUS ALUMINUM OXIDE

Such a region can be fabricated using a small number of cycles of an ALD process.

5 Claims, 8 Drawing Sheets

(51) Int. Cl.
*H01L 27/105* (2006.01)
*C23C 16/40* (2006.01)
*H01L 49/00* (2006.01)

(52) U.S. Cl.
CPC ...... *H01L 27/2436* (2013.01); *H01L 27/2481* (2013.01); *H01L 45/00* (2013.01); *H01L 45/1233* (2013.01); *H01L 45/1616* (2013.01); *H01L 49/00* (2013.01)

(56) References Cited

U.S. PATENT DOCUMENTS

| | | | |
|---|---|---|---|
| 2008/0318442 A1 | 12/2008 | Ogawa et al. | |
| 2012/0064689 A1 | 3/2012 | Hirota et al. | |
| 2013/0026438 A1* | 1/2013 | Wang | H01L 45/1233 257/4 |
| 2013/0168632 A1* | 7/2013 | Moon | H01L 45/08 257/4 |
| 2013/0193396 A1* | 8/2013 | Nakano | H01L 45/145 257/4 |
| 2013/0299763 A1 | 11/2013 | Moon et al. | |
| 2014/0070289 A1 | 3/2014 | Tanaka et al. | |
| 2014/0131649 A1* | 5/2014 | Daibou | H01L 43/08 257/2 |
| 2014/0187018 A1* | 7/2014 | Malhotra | H01L 28/56 438/396 |
| 2015/0069315 A1* | 3/2015 | Shih | H01L 45/16 257/4 |

FOREIGN PATENT DOCUMENTS

| | | |
|---|---|---|
| JP | 2012-080094 A | 4/2012 |
| JP | 2013-089740 A | 5/2013 |
| JP | 5309615 B2 | 10/2013 |
| JP | 2014-022660 A | 2/2014 |
| JP | 2014-053568 A | 3/2014 |
| WO | 2012/073471 A1 | 6/2012 |

OTHER PUBLICATIONS

S. Seo et al., "Reproducible resistance switching in polycrystalline NiO films", Applied Physics Letters, vol. 85, pp. 5655-5657 (2004).

S. W. Lee et al., "Creation and Control of Two-Dimensional Electron Gas Using Al-Based Amorphous Oxides/SrTiO3 Heterostructures Grown by Atomic Layer Deposition", Nano Letters, vol. 12, pp. 4775-4783, (2012).

H. D. Lee et al., "Reduction of native oxides on GaAs during atomic layer growth of Al2O3", Applied Physics Letters, vol. 94, 222108 (2009).

International Search Report for corresponding International Patent Application No. PCT/JP2016/050853 dated Mar. 29, 2016.

Office Action issued in corresponding Japanese Patent Application No. 2015-005464, dated Jan. 15, 2019.

* cited by examiner

FIG. 7
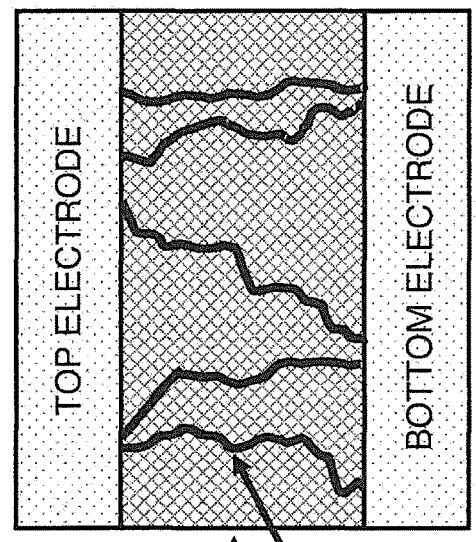
A WITH AMORPHOUS ALUMINUM OXIDE
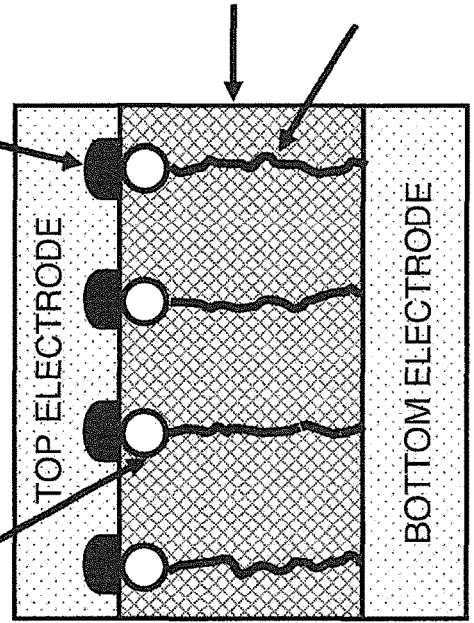
B WITHOUT AMORPHOUS ALUMINUM OXIDE

VARIABLE RESISTANCE DEVICE AND METHOD FOR MANUFACTURING SAME

INCORPORATION BY REFERENCE

This application claims priority to Japanese Patent Application No. 2015-005464 filed on Jan. 15, 2015, which is incorporated herein by reference in its entirety.

TECHNICAL FIELD

The present invention relates to a variable resistance device that can be used as a non-volatile memory or the like, and a method for manufacturing the same.

BACKGROUND ART

One example of typical non-volatile memories is a resistive random access memory (ReRAM) that uses resistance change caused by voltage application to insulating films provided between top and bottom electrodes. Researches and developments have been conducted vigorously to achieve high performance, highly reliable, and low cost ReRAMs.

ReRAMs are formed in a simple metal-insulator-metal (MIM) structure and have a low process temperature, making ReRAMs be compatible with complementary metal-oxide-semiconductor (CMOS) logic. Two main ways of memory operations of ReRAMs have been proposed as follows. One is a mechanism for forming conductive paths (filaments) extending between top and bottom electrodes by applying a voltage to diffuse an electrode material into an insulating film. Copper (Cu) and platinum (Pt) have been examined as typical electrode materials. The other is a mechanism for forming filaments between top and bottom electrodes by introducing oxygen vacancy into the insulating film by reduction reaction, using an ionic metal oxide as the insulating film. As a typical ionic metal oxide, nickel oxide (NiO), hafnium oxide ($HfO_2$), titanium oxide ($TiO_2$), and tantalum oxide ($TaO_x$) have been examined. Memory operation is carried out using a low resistance state in which filaments are connected and a high resistance state in which filaments are disconnected in accordance with changes of the direction of voltage application (see, e.g., NON-PATENT LITERATURE 1, 2).

ReRAMs require initial operation called forming, which is regarded as soft breakdown, to form the filaments. To decrease a high forming voltage as a result of random forming of the filaments, it has been disclosed that a polycrystalline oxide layer, which acts as an insulating film, and an amorphous layer thicker than the polycrystalline oxide layer are stacked to use filaments generated in the boundaries of the polycrystalline oxide layer (see, e.g., PATENT LITERATURE 1). An oxygen drawing substance is distributed at an interface between the electrode and the insulating film to introduce oxygen vacancy into the insulating layer (see, e.g., PATENT LITERATURE 2).

However, in the formation of the filaments generating from the boundaries between polycrystalline oxide layers disclosed in the above PATENT LITERATURE, the number and physical property of the boundaries are largely affected by the fabrication conditions of the polycrystalline layers, causing variations in the forming voltage. Meanwhile, the oxygen depleting substance to be distributed should be an oxide with oxygen vacancy, as represented by $TiO_x$. It is difficult to regulate the amount of oxygen vacancy that determines the oxygen drawing amount from the insulating film. This makes it difficult to control the formation of filaments.

In one report, the oxygen vacancy is introduced by removing oxygen from the top surface of single crystal $SrTiO_3$. Oxygen of O—Ti bonds on the top surface of $SrTiO_3$ is reacted with trimethylaluminium (TMA), Al$(CH_3)_3$, which is a raw material for film forming of an aluminum oxide ($Al_2O_3$) film by atomic layer deposition (ALD). As a result, a two-dimensional electron gas is generated (see, e.g., NON-PATENT LITERATURE 3). However, the removal of oxygen from the top surface suggested by the above NON-PATENT LITERATURE is limited to O—Ti bonds ordered on the single crystal substrate. A reaction between TMA and oxygen of O—Ti bonds in titanium oxide ($TiO_2$) formed by amorphous body or polycrystal and the corresponding introduction of oxygen vacancy have not been suggested.

In another report, natural oxide films can be removed by reacting oxygen of a natural oxide generated on a GaAs substrate (e.g., $GaO_x$, $AsO_x$) and TMA in the process of generating an aluminum oxide ($Al_2O_3$) film by ALD with TMA being as a raw material (see, e.g., NON-PATENT LITERATURE 4). However, the natural oxide disclosed in the above NON-PATENT LITERATURE is an oxygen-poor oxide, according to its stoichiometric ratio, in which oxygen easily reacts with TMA and no suggestion has been made about introducing oxygen vacancy by the reaction of oxygen in an oxygen-rich oxide having at least a stoichiometric composition ratio.

CITATION LIST

Patent Literature

PATENT LITERATURE 1: Japanese Patent No. 5309615
PATENT LITERATURE 2: JP 2014-22660 A

Non-Patent Literature

NON-PATENT LITERATURE 1: B. J. Choi et al., "Resistive switching mechanism of TiO2 thin films grown by atomic-layer deposition", J. Appl. Phys. Vol. 98, 033715 (2005).
NON-PATENT LITERATURE 2: S. Seo et al., "Reproducible resistance switching in polycrystalline NiO films", Appl. Phys. Lett., Vol. 85, 5655 (2004).
NON-PATENT LITERATURE 3: S. W. Lee et al., Nano Lett., Vol. 12, 4775 (2012).
NON-PATENT LITERATURE 4: H. D. Lee et al., Appl. Phys. Lett., Vol. 94, 222108 (2009).

SUMMARY OF INVENTION

Technical Problem

The present invention has been made in view of the above situation and it is an object of the present invention to provide a variable resistance device, such as a ReRAM, having a uniform distribution of an amount of oxygen vacancy, and a method for manufacturing such a variable resistance device.

Solution to Problem

According to an aspect of the present invention, a variable resistance device includes a film of metal oxide disposed between first and second electrodes, with island-shaped or particulate objects of amorphous aluminum oxide or aluminum oxycarbide being distributed between the first electrode and the metal oxide film.

The average particle size of the island-shaped or particulate objects may be from 0.1 nm to 0.6 nm.

At least an element included in the metal oxide may have free energy for formation of oxides larger than free energy for formation of oxides of aluminum oxide at least in a partial range of a temperature range from 0° C. to 400° C.

The metal oxide may include at least an element selected from the group consisting of titanium (Ti), tantalum (Ta), niobium (Nb), zirconium (Zr), and hafnium (Hf).

According to another aspect of the present invention, a method for manufacturing a variable resistance device includes forming the island-shaped or particle-shaped objects made of aluminum oxide or aluminum oxycarbide on the metal oxide by ceasing the deposition before the deposition of the aluminum oxide or aluminum oxycarbide regions continues and the aluminum oxide or aluminum oxycarbide formed isolated from each other on the metal oxide at the early stage of deposition extends laterally and connect with each other to form a continuous film.

The deposition may be carried out by atomic layer deposition (ALD).

The number of ALD cycles carried out in the deposition by the ALD may be equal to or smaller than three cycles.

The deposition by the ALD may use trimethylaluminum.

The deposition by the ALD may be carried out in a temperature range from 0° C. to 400° C.

The deposition by the ALD may be carried out in a temperature range from 22° C. to 300° C.

Advantageous Effects of Invention

The present invention can provide a variable resistance device, such as a ReRAM, having a low and stable forming voltage and an excellent resistance change characteristic.

BRIEF DESCRIPTION OF DRAWINGS

FIG. 7 is schematic diagrams of forming filaments with amorphous aluminum oxide according to the embodiment of the present invention.

DESCRIPTION OF EMBODIMENTS

Figure 1:
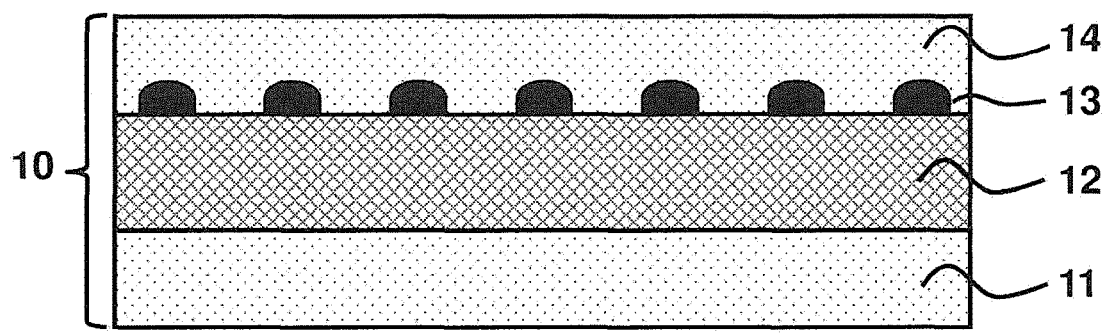
FIG. 1 is a schematic cross-sectional view of a variable resistance device according to an embodiment of the present invention.

A variable resistance device and a method for manufacturing a variable resistance device according to an embodiment of the present invention will be described below by referring to the accompanying drawings. For convenience of viewing, sizes and ratios of constituent components are changed appropriately in the drawings. The following description mainly relates to a resistive random access memory, as it is a representative use of the variable resistance device, but as a matter of course, the variable resistance device can be applied to other uses without losing generality.

FIG. 1 is a schematic cross-sectional view of a resistive random access memory 10 according to an embodiment of the present invention. The resistive random access memory 10 includes a metal oxide film 12 provided between an upper electrode 14 and a lower electrode 11. Amorphous aluminum oxide or aluminum oxycarbide 13 is distributed in an island-shaped or particle-shaped formation having an average particle size from 0.1 nm to 0.6 nm between the upper electrode 14 and the metal oxide film 12.

Figure 2:
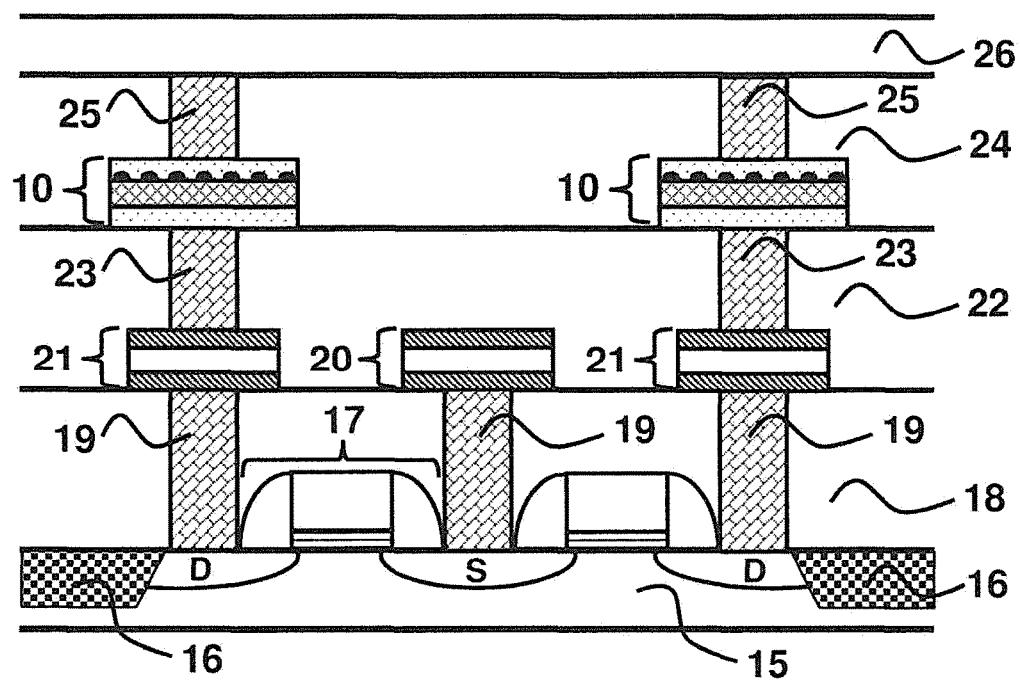
FIG. 2 is a schematic cross-sectional view of a variable resistance device of type 1T-1R according to the embodiment of the present invention.

FIG. 2 is a schematic cross-sectional view of a resistive random access memory 10 of type 1T-1R according to the embodiment of the present invention. A transistor 17 is formed on a silicon substrate 15 that is divided by electrical isolation 16. The transistor 17 includes a source (S) and a drain (D) formed by a generally COMS process. A ground line 20 is formed on a contact plug 19 formed in an interlayer insulating film 18 on the source (S). An interconnect line 21 is formed on another contact plug 19 formed in the interlayer insulating film 18 on the drain (D). A contact plug 23 is formed in an interlayer insulating film 22 on the interconnect line 21. The lower electrode 11 of the resistive random access memory 10 is then formed on the contact plug 23. A contact plug 25 is formed penetrating through the upper electrode 14 of the resistive random access memory 10 having been formed as described above. A bit line 26 is formed on the contact plug 25 through the interlayer insulating film 24.

Figure 3:
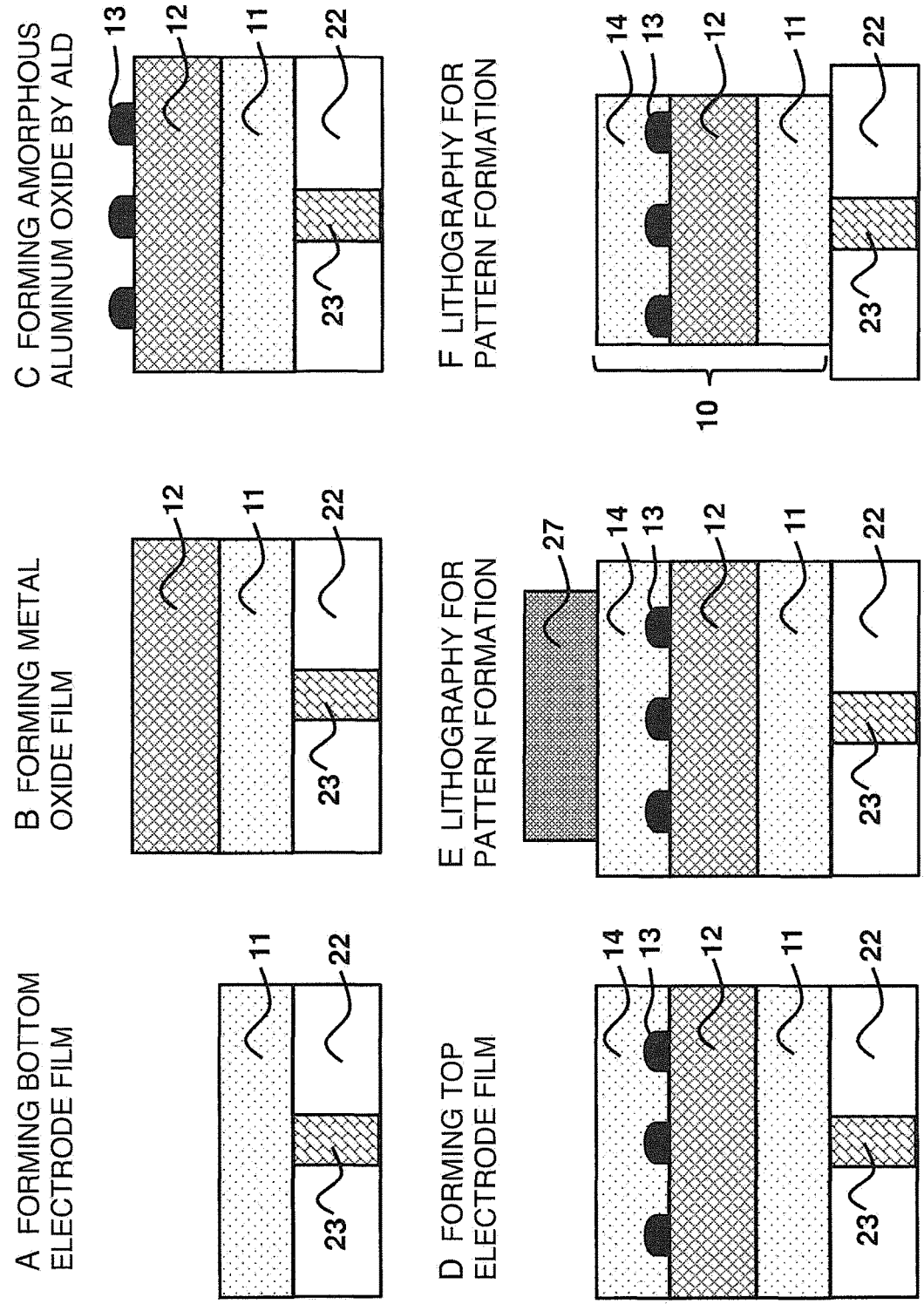
FIG. 3 illustrates manufacturing steps of the variable resistance device according to the embodiment of the present invention.

FIG. 3 illustrates manufacturing steps of the resistive random access memory. In A of FIG. 3, the lower electrode 11 is formed on the contact plug 23 that has been formed in the interlayer insulating film 22. The lower electrode 11 is formed by stacking an adhesion layer and a conductive layer. The adhesion layer is made of Ti or chromium (Cr). The conductive layer can be made of a material ordinarily known in the art. Examples of the material for forming the conductive layer include metal materials, such as aluminum (Al), Pt, gold (Au), silver (Ag), Cu, nickel (Ni), molybdenum (Mo), Ta, tungsten (W), or alloys of these metal materials, or conductive oxides, such as indium tin oxide (ITO) or zinc oxide (ZnO). The conductive layer may be formed by stacking two or more layers, for example, by plating the surface of the conductive layer with a metal material.

The metal oxide film 12 is formed as illustrated in B of FIG. 3. The metal oxide film 12 is made of a material in which at least an element included in the metal oxide film has free energy for formation of oxides larger than free energy for formation of oxides of $Al_2O_3$, at least in a partial range of a temperature range from 0° C. to 400° C. (see TABLE 1). Naturally, the forming is carried out in a temperature range that satisfies the magnitude relationship mentioned above, that is, [free energy for generating metal oxide (at least an element in the metal oxide film 12)]>[free energy for generating metal oxide ($Al_2O_3$)] (or in the temperature range in which oxygen vacancy is generated on the metal oxide film 12).

The metal oxide film 12 may be made of a material that includes at least an element selected from the group consisting of Ti, Ta, Nb, Zr, and Hf Such a metal oxide film 12 exhibits an excellent insulating characteristic in some manufacturing conditions, so that oxygen vacancy cannot easily be formed in the metal oxide film 12. Therefore, a high forming voltage needs to be applied to establish forming by the oxygen vacancy. In addition, forming is established randomly at various locations with large variations among memories.

Figure 4:
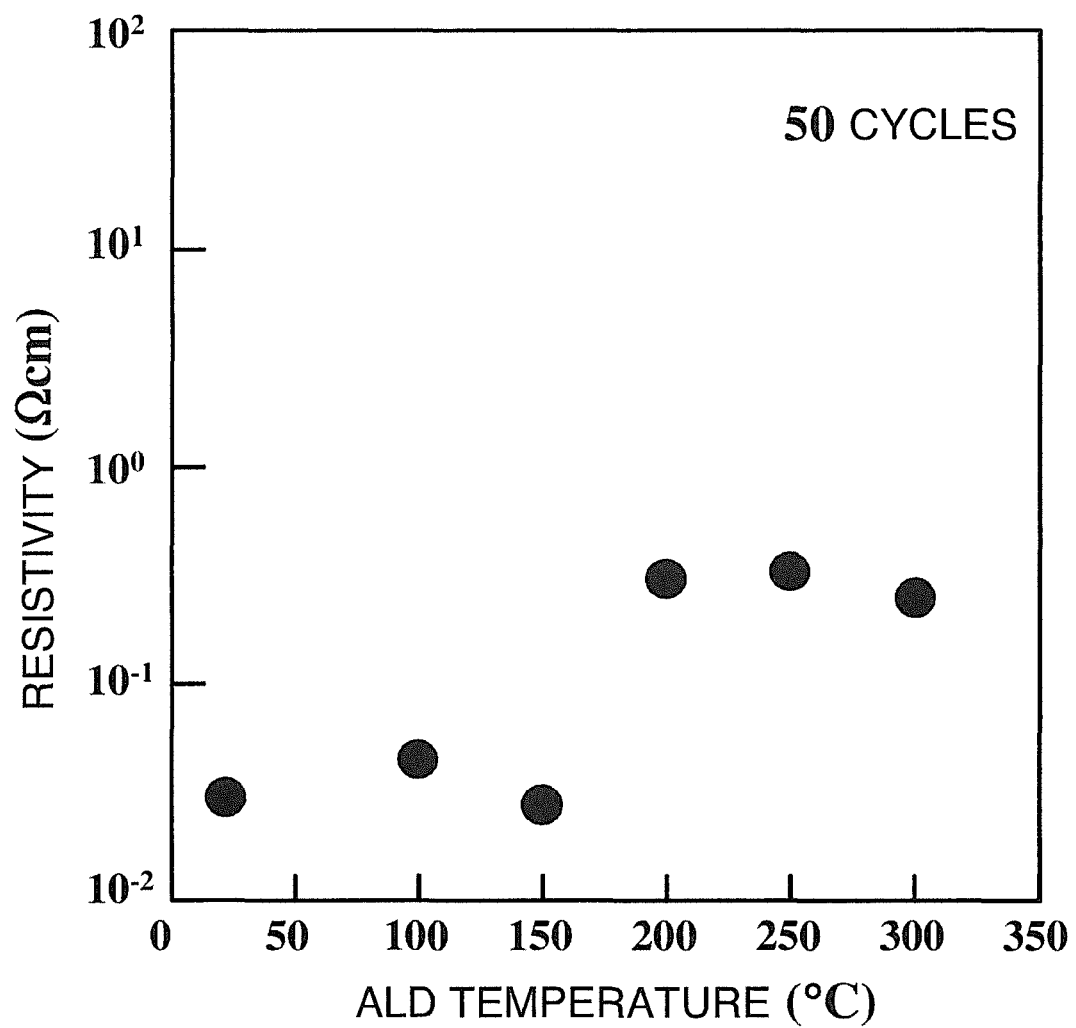
FIG. 4 illustrates results of changes in resistivity of $TiO_2$ film relative to film forming temperatures of ALD according to the embodiment of the present invention.
Figure 5:
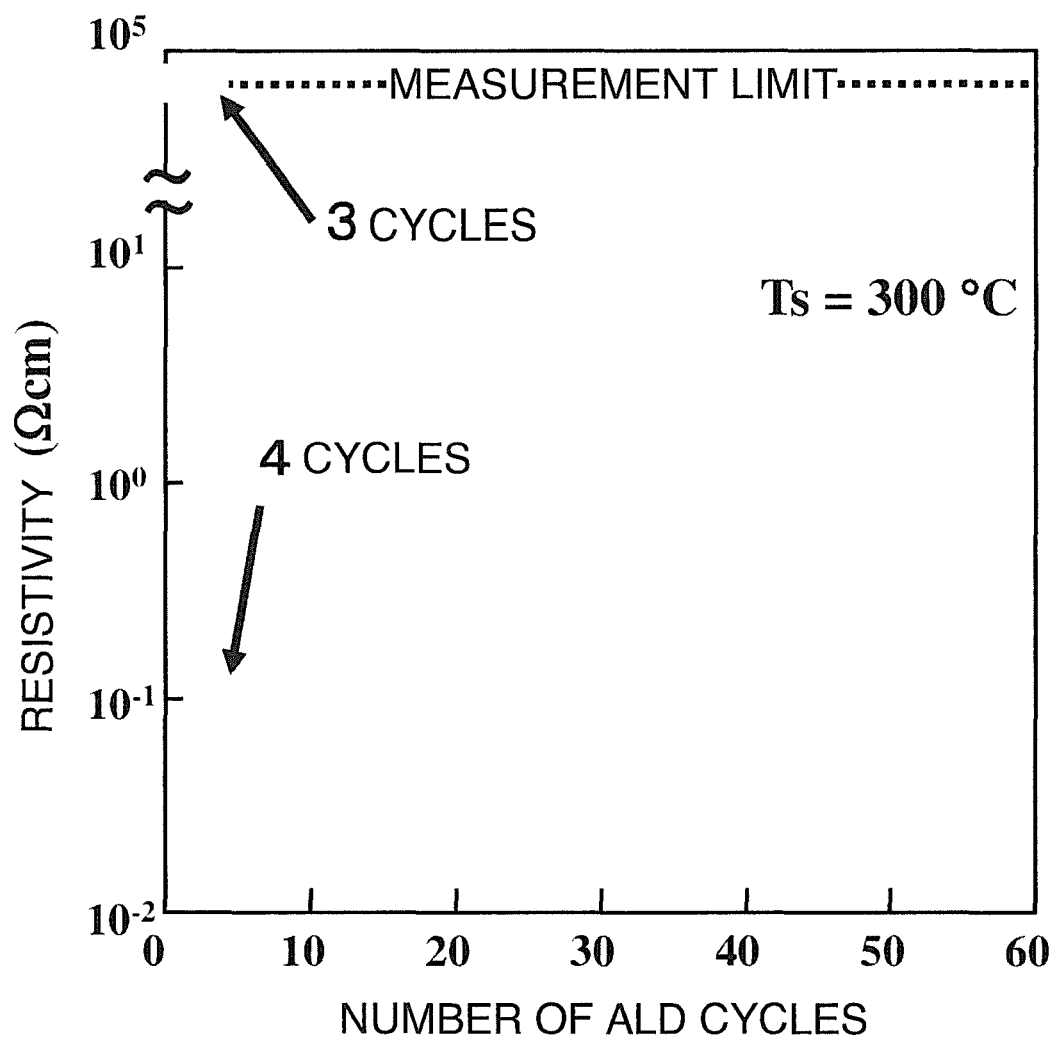
FIG. 5 illustrates results of changes in resistivity of the $TiO_2$ film relative to the number of ALD cycles according to the embodiment of the present invention.

The inventors of the present application have repeatedly examined to solve this problem to find that a $TiO_2$ film changes from insulator to conductor at a relatively early stage of an aluminum oxide film deposition by ALD with TMA precursor and a $H_2O$ gas on a $TiO_2$ film that is in rutile structure and has a film thickness of 10 nm formed on a glass substrate. FIG. 4 illustrates changes in resistivity of $TiO_2$ film, which is in the rutile structure, relative to ALD deposition temperature. The number of ALD cycles is fixed to 50 cycles. The resistivity is determined by a Hall measurement. The resistivity value decreases in the order from $10^{-2}$ to $10^{-1}$ Ωcm over the entire temperature range. This represents the change of $TiO_2$ from the insulator to the conductor. FIG. 5 illustrates changes in resistivity of the $TiO_2$ film relative to the number of ALD cycles with the ALD deposition temperature fixed at 300° C. Up to three ALD cycles, the resistivity value exhibits a measurement-limit insulating characteristic, but at four ALD cycles, the resistivity value sharply drops to $10^{-1}$ Ωcm, representing conversion to the conductor. The resistivity value is in the order of $10^{-2}$ to $10^{-1}$ Ωcm after three cycles, representing that the $TiO_2$ film remains as the conductor.

Figure 6:
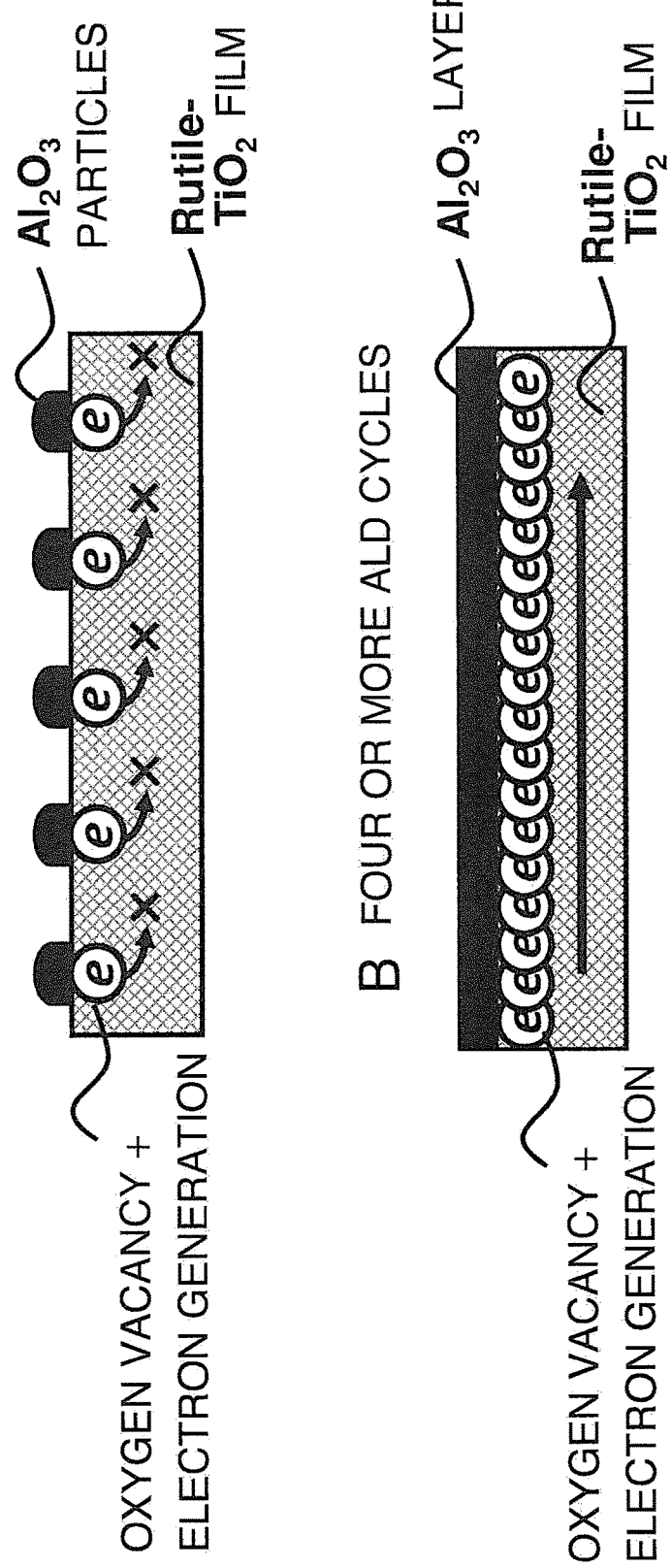
FIG. 6 is a schematic diagram for explaining a difference in mechanism for oxygen vacancy and electron generation between three cycles or less and four cycles or more of ALD according to the embodiment of the present invention.

A difference between three cycles and four cycles or more is described by referring to FIG. 6. The ALD controls a film thickness of $Al_2O_3$ film by changing the number of cycles for alternately supplying the TMA precursor, and the $H_2O$ gas. The film forming speed is from 0.08 to 0.15 nm/cycle, and the formation is in the island-shaped and particulate formation and in a distributed manner up to three cycles, as illustrated in A of FIG. 6, but changes to a film after three cycles, as illustrated in B of FIG. 6. Even in the island-shaped and particulate regions, electrons are generated by introducing oxygen vacancy to the $TiO_2$ film. This is supposedly carried out in accordance with the following mechanism. When the raw material, TMA, adheres to the surface of the $TiO_2$ film, oxygen on the top surface of the $TiO_2$ film reacts with Al element and $CH_3$ group of the raw material, TMA, to generate $Al_2O_3$ and $CO_2$ gas. Along with the generation, oxygen vacancy occurs in the $TiO_2$ film. Formula 1 represents this reaction. This reaction is also disclosed in NON-PATENT LITERATURE 3.

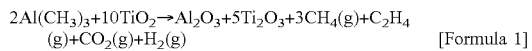
[Formula 1]

Electrons do not flow up to three cycles due to a distance between adjacent oxygen vacancy locations. After three cycles, electrons begin to flow because the distance between the oxygen vacancy locations approaches to a range in which electrons can flow. Formula 1 resembles oxygen movement caused by a difference in free energy for formation of oxides when two kinds of metal oxides come to touch each other. In a temperature range from 0° C. to 400° C. of ALD deposition, the free energy for formation of oxides of $Al_2O_3$, for example, at 22° C. is −1060 kJ/mol, which is smaller than that of $TiO_2$ in the rutile structure, −888 kJ/mol, facilitating oxygen vacancy of $TiO_2$. As illustrated in TABLE 1 that lists the free energy of metal oxides for oxide generation, a similar phenomenon as in the case of $TiO_2$ film occurs in terms of oxygen vacancy when the film of hafnium oxide ($HfO_2$), zirconium oxide ($ZrO_2$), niobium oxide (NbO), or tantalum oxide ($Ta_2O_5$) is formed by ALD.

TABLE 1

| OXIDE | TEMPERATURE (° C.) | FREE ENERGY FOR GENERATING OXIDE (kJ/mol) |
| --- | --- | --- |
| $Al_2O_3$ | 0 | −1065 |
| | 22 | −1060 |
| | 300 | −999 |
| | 400 | −977 |
| $HfO_2$ | 0 | −1014 |
| | 22 | −1010 |
| | 300 | −962 |
| | 400 | −946 |
| $ZrO_2$ | 0 | −975 |
| | 22 | −1039 |
| | 300 | −989 |
| | 400 | −971 |
| $TiO_2$ (Rutile) | 0 | −892 |
| | 22 | −888 |
| | 300 | −838 |
| | 400 | −820 |
| NbO | 0 | −779 |
| | 22 | −775 |
| | 300 | −728 |
| | 400 | −670 |
| $Ta_2O_5$ | 0 | −764 |
| | 22 | −760 |
| | 300 | −713 |
| | 400 | −696 |

In a temperature range from 0° C. to 400° C., amorphous $Al_2O_3$ is formed by ALD. It is generally known to persons in the art that thermal treatment at 900° C. or more is required for crystallization. In particular, low defect and high quality $Al_2O_3$ can preferably be formed in a stable manner in a film forming temperature range from 22° C. to 300° C. by ALD. If this condition is not satisfied, aluminum oxide including an impurity would be formed. Even when the $H_2O$ gas supply is insufficient or not present, amorphous aluminum oxycarbide is formed similarly in the island-shaped or particulate formation up to three cycles.

Preferably, the amorphous aluminum oxide or aluminum oxycarbide has an average particle size from 0.1 nm to 0.6 nm. If roughness becomes too large, insufficient contact with the upper electrode would occur.

According to the operation principle of the resistive random access memory, the oxide film 12 sandwiched between the lower electrode 11 and the upper electrode 14 should be an insulator, so that the metal oxide film that has turned to a conductor cannot be used. However, as described above, at the early stage of deposition of aluminum oxide or aluminum oxycarbide, the metal oxide film maintains its insulating characteristic although oxygen vacancy is present under the deposition. By using this characteristic, a resistive random access memory capable of using the oxygen vacancy formed under the above-described aluminum oxide or aluminum oxycarbide as nuclei for growing filaments for the forming can be implemented. This is an underlying idea of the inventors to allow them to conceive the present invention.

To satisfy the above condition in accordance with such an idea, the island-shaped or particulate aluminum oxide 13 is formed by up to three cycles of ALD on the metal oxide film 12, as illustrated in C of FIG. 3. The upper electrode 14 is formed as illustrated in FIG. 3D. The upper electrode 14 can be made of a material ordinarily known in the art. Examples of materials for forming such an electrode include a metal material, such as Al, Pt, Au, Ag, Cu, Ni, Mo, Ta, W, or alloys of these metal materials, or a conductive oxide, such as ITO or ZnO. These electrodes may be formed by stacking two or more layers, for example, by plating the surface of the electrodes with a metal material.

As illustrated in E of FIG. 3, a resist pattern 27 in a size of a memory is formed by an ordinary photolithography process. After etching down to the lower electrode 11 by an etching process, the resist film is peeled off to complete a resistive random access memory, as illustrated in F of FIG. 3.

FIG. 7 is a schematic cross-sectional view illustrating formation of filaments by oxygen vacancy when amorphous aluminum oxide is present (A) and not present (B). In the case of B, a large forming voltage is applied to introduce oxygen vacancy. The oxygen vacancy occurs randomly and the filaments are formed from such oxygen vacancy. As a result, a large variation occurs among memories. Specifically, the forming voltage is high in the structure of B because a high voltage is necessary for forming oxygen vacancy that serves as nuclei of the filaments on the surface of the oxide layer in the initial step of forming. In addition, the voltage necessary for forming the oxygen vacancy changes according to the film quality of the surface, that is, only a small difference in manufacturing conditions. Thus, large variations occur among chips. On the other hand, in the case of A, the oxygen vacancy is formed on the surface of the $TiO_2$ film facing the aluminum oxide in a distributed manner. It has been found, therefore, a low forming voltage is necessary and a variation among memories is small. In other words, in the structure of A, the oxygen vacancy already exists when aluminum oxide is formed on the surface of the oxide layer. A high forming voltage is not necessary in the initial step of the forming on the contrary to the conventional structure. In addition, the variation decreases because the influence of the forming voltage on the film quality is eliminated.

The ALD has been described as a method for forming the island-shaped or particulate aluminum oxide or aluminum oxycarbide, but the method is not limited to ALD. Any method can be adopted so long as the method can control the formation of the island-shaped or particulate regions of aluminum oxide or aluminum oxycarbide in such a manner to cease the growth process before such regions extend laterally and connect with each other to form a continuous film. For example, a MOCVD method used with a supply of TMA gas can be used for growth control.

EXAMPLES

Examples of the present invention will be described below, but these examples do not limit the scope of the present invention in any way. It is, therefore, apparent to persons in the art that various changes and corrections are possible within the scope of the present invention and the range of the appended claims.

In the example, the structure similar to the resistive random access memory 10 illustrated in FIG. 1 was formed on silicon oxide ($SiO_2$) (100 nm).

The resistive random access memory of the present example was made with an Si substrate by forming an $SiO_2$ layer having a thickness of 100 nm by surface oxidization of an Si substrate, followed by forming a Ti film, as an adhesion layer, having a film thickness of 10 nm by DC sputtering at room temperature with Ar gas at 0.1 Pa and sputtering power of 200 W. The lower electrode 11 was formed by forming a Pt film having a film thickness of 100 nm as a conductive film on the Ti film by DC sputtering at room temperature with Ar gas at 0.1 Pa and sputtering power of 200 W.

Subsequently, a $TiO_2$ film having a thickness of about 10 nm was formed as the metal oxide film 12 on the Pt film by an ALD apparatus at a temperature in a TDMAT raw material container of 100° C., a temperature of an $H_2O$ container of 20° C., a degree of vacuum at 10 Pa, and a growth temperature of 300° C. in 200 cycles. Each cycle consists of a supply sequence of raw material: tetrakis-dimethlamido-titanium (TDMAT)→Ar purge gas→$H_2O$ oxide gas→Ar purge gas. The $TiO_2$ film was in the amorphous structure. Such amorphous films were treated with heat at 500° C. in an oxygen atmosphere and at 800° C. in a nitrogen atmosphere, respectively, to form anatase and rutile structures. An example of the $TiO_2$ film in the rutile structure is described below.

Subsequently, the amorphous aluminum oxide 13 was formed on the $TiO_2$ film in the rutile structure by an ALD apparatus at a temperature in TMA raw material container from 0° C. to 20° C., a temperature of $H_2O$ container from 0° C. to 20° C., a degree of vacuum at 10 Pa, and a growth temperature from 0° C. to 400° C. in 1 to 100 cycles. Each cycle consists of a supply sequence of raw material, TMA→Ar purge gas→$H_2O$ oxide gas→Ar purge gas. An example described below was made at a film forming temperature of 300° C. in three cycles.

Subsequently, the upper electrode 14 having a film thickness of 100 nm was made by depositing a Pt film through a stencil mask that includes pores each having a diameter of 100 μm by DC sputtering at room temperature, at Ar gas of 0.1 Pa, and sputtering power of 200 W.

Figure 8:
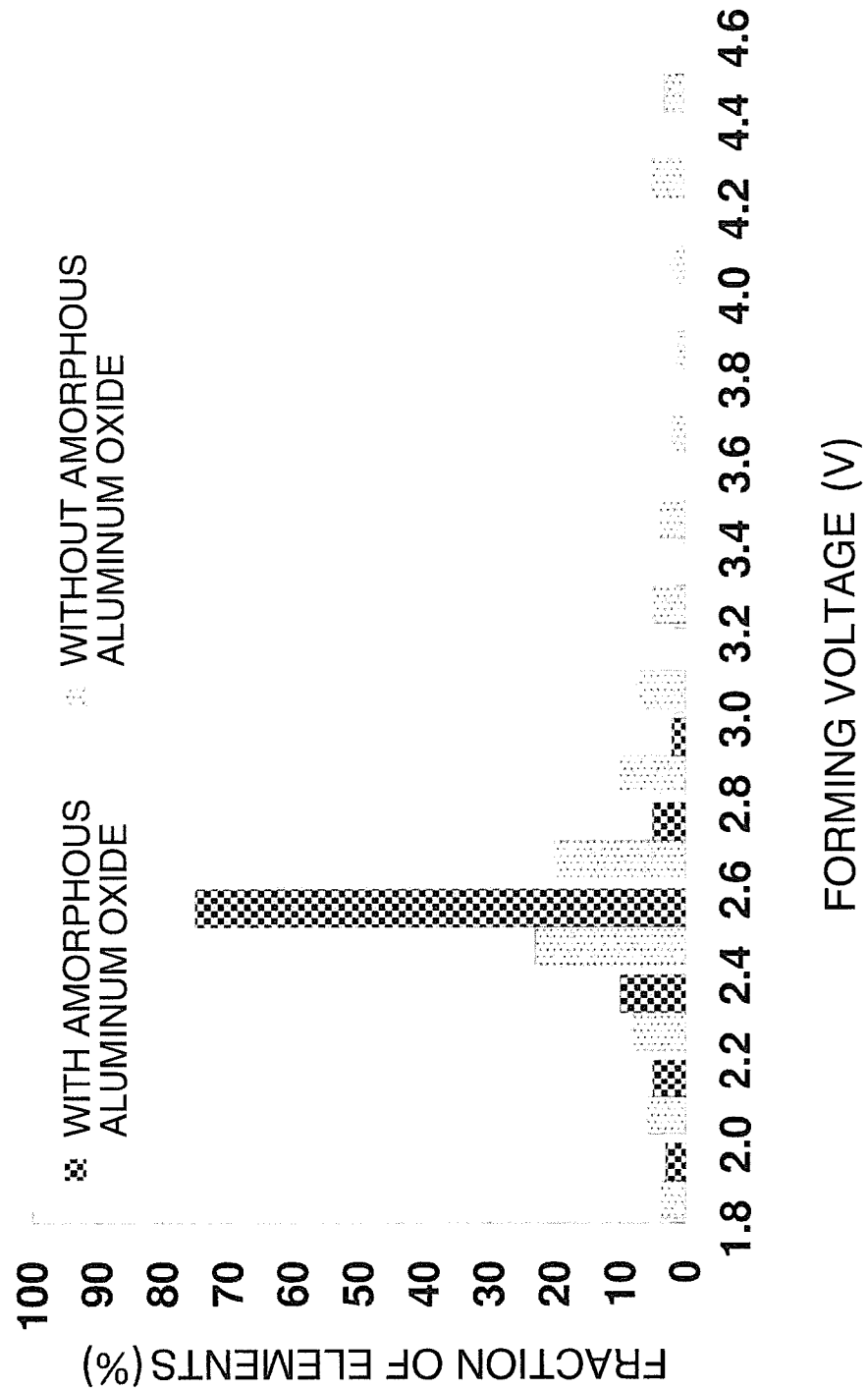
FIG. 8 illustrates a variation characteristic of forming voltage among elements according to the embodiment of the present invention.
Figure 9:
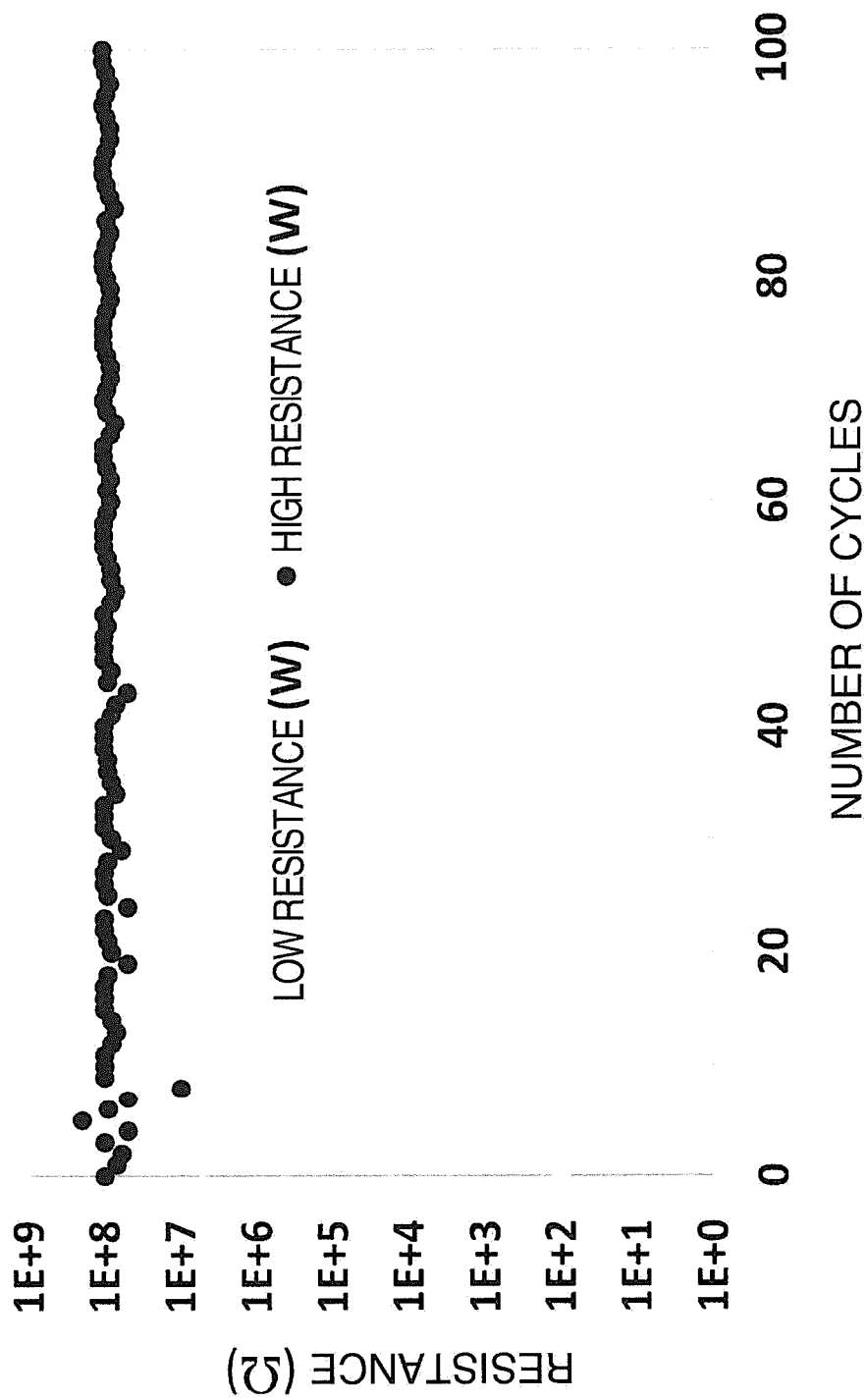
FIG. 9 illustrates reliability of a resistive random access memory that does not include amorphous aluminum oxide relative to the number of voltage cycles according to the embodiment of the present invention.

Thus, the resistive random access memory 10 was manufactured and its characteristics were measured in an evaluation circumstance at a temperature of 25° C. in a dark place in vacuum. FIGS. 8 and 9 are graphs illustrating results of measurement of the characteristics of the resistive random access memory 10, in which FIG. 8 illustrates a variation characteristic of forming voltage between different elements and FIG. 9 illustrates a reliability characteristic.

FIG. 8 is a bar graph illustrating the variation characteristic in forming voltage among elements. Bars with relatively small checkerboard pattern represent measurement results of the resistive random access memory 10 of the present example, while bars with distributed pattern of small dots represent data of a comparative example in which no amorphous aluminum oxide is provided. The resistive random access memory that does not include the amorphous aluminum oxide exhibited a wide distribution range of the forming voltage from 1.8 to 4.5 V. To securely establish forming in the element, the forming voltage needed to be applied even in a high voltage region. On the other hand, the resistive random access memory that includes the amorphous aluminum oxide according to the present example exhibited that about 75% of the memories was concentrated at the forming voltage of 2.5 V and the distribution range of the forming voltage was much narrower than that of the comparative example data. Namely, the present example exhibited an effect of decreasing the variation of the forming voltage.

FIG. 9 illustrates the reliability characteristic of the resistive random access memory that includes amorphous aluminum oxide after the forming relative to the number of voltage cycles. A rectangular-wave voltage having an absolute value of 0.3 V and inverted polarities for every 10 msec was applied for 100 cycles. From the beginning of the repetition test until the repetition of 100 cycles was finished, a resistance difference (ratio of high resistance to low resistance), which was the important characteristic of the resistance change memory, exhibited favorable results of five-order difference with the order of 1E+3 in the low resistance region and the order of 1E+8 in the high resistance region. The five-order results were maintained after 100 cycles, representing a high reliability. On the other hand, the same cycle test was executed for the conventional capacitor that does not include aluminum oxide illustrated in FIG. 8. The result exhibited a gradual increase of low resistance values after the number of cycles exceeded 60 cycles, representing a trend that the ratio of high resistance value to low resistance value decreased to below the five-order values. In some cases, breaking a capacitor in which the high resistance value was equal to the low resistance value was recognized.

As a result, the operation of the resistive random access memory of the present invention was confirmed and the usefulness of the present invention was proved.

INDUSTRIAL APPLICABILITY

As described above, the present invention can largely contribute to improvement of the performance of the variable resistance device which is typically represented by the resistive random access memory.

REFERENCE SIGNS LIST

10 Resistive random access memory
11 Lower electrode
12 Metal oxide film
13 Amorphous aluminum oxide or aluminum oxycarbide
14 Upper electrode
15 Silicon substrate
16 Electrical isolation
17 Transistor
18, 22, 24 Interlayer insulating film
19, 23, 25 Contact plug
20 Ground line
21 Interconnect line
26 Bit line

The invention claimed is:

1. A method for manufacturing a variable resistance device, comprising:
   forming a first electrode;
   forming a layer of metal oxide on the first electrode, the metal oxide comprising at least one element having an absolute value of free energy for formation of oxide smaller than an absolute value of free energy for formation of aluminum oxide in at least a partial range of a temperature range from 0° C. to 400° C.;
   forming island-shaped or particulate objects of amorphous aluminum oxide or aluminum oxycarbide on the layer of metal oxide, the island-shaped or particulate objects being formed by atomic layer deposition (ALD) with a number of ALD cycles carried out in the deposition equal to or smaller than three cycles, wherein after the deposition of amorphous aluminum oxide or aluminum oxycarbide on the layer of metal oxide is started the deposition is ceased before mutually isolated regions formed at an early stage of the deposition extend laterally during the deposition to merge into a form of a continuous film and oxygen vacancy being formed at interfaces between the layer of metal oxide and the island-shaped or particulate objects and serving as nuclei of filaments in the layer of metal oxide when applying forming voltage; and
   forming a second electrode on a surface of the layer of metal oxide and surfaces of the island-shaped or particulate objects.

2. The method for manufacturing the variable resistance device according to claim 1, wherein the deposition by the ALD is carried out with trimethylaluminum.

3. The method for manufacturing the variable resistance device according to claim 2, wherein the deposition by the ALD is carried out at a temperature from 0° C. to 400° C.

4. The method for manufacturing the variable resistance device according to claim 3, wherein the deposition by the ALD is carried out at a temperature from 22° C. to 300° C.

5. The method for manufacturing the variable resistance device according to claim 1, wherein the metal oxide includes at least one element selected from the group consisting of titanium (Ti), tantalum (Ta), niobium (Nb), zirconium (Zr), and hafnium (Hf).

* * * * *